(12) United States Patent
Akiba et al.

(10) Patent No.: US 7,026,382 B2
(45) Date of Patent: Apr. 11, 2006

(54) CONDUCTIVE RESIN COMPOSITION

(75) Inventors: Hideki Akiba, Gunma-ken (JP); Masachika Yoshino, Gunma-ken (JP); Nobuhiro Ichiroku, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/422,011

(22) Filed: Apr. 24, 2003

(65) Prior Publication Data

US 2003/0216505 A1    Nov. 20, 2003

(30) Foreign Application Priority Data

Apr. 24, 2002    (JP) .............................. 2002-122239

(51) Int. Cl.
- C08K 5/54    (2006.01)
- H01B 1/24    (2006.01)
- C08L 77/00   (2006.01)
- C08L 79/00   (2006.01)
- C08L 63/00   (2006.01)

(52) U.S. Cl. ...................... 524/268; 524/588; 524/589; 524/594; 524/492; 524/493; 524/439; 524/434; 523/400; 523/443; 523/466; 252/512; 252/519.31; 252/519.33

(58) Field of Classification Search ................ 524/588, 524/589, 594, 492, 493, 439, 434, 268; 252/512, 252/519.31, 519.33
See application file for complete search history.

(56) References Cited

U.S. PATENT DOCUMENTS

| | | | |
|---|---|---|---|
| 3,609,104 A | * | 9/1971 | Ehrreich et al. ............ 252/511 |
| 3,746,662 A | * | 7/1973 | Adelman .................... 252/513 |
| 4,610,808 A | * | 9/1986 | Kleiner ...................... 252/512 |
| 5,412,014 A | * | 5/1995 | Romenesko ................ 524/416 |
| 5,538,793 A | * | 7/1996 | Inokuchi et al. ............ 428/407 |
| 6,361,716 B1 | * | 3/2002 | Kleyer et al. ............... 252/514 |
| 6,433,057 B1 | * | 8/2002 | Bhagwagar et al. ........ 252/514 |
| 6,465,082 B1 | * | 10/2002 | Takezawa et al. .......... 428/209 |
| 6,469,090 B1 | * | 10/2002 | Azechi et al. .............. 524/492 |

FOREIGN PATENT DOCUMENTS

| | | |
|---|---|---|
| JP | 2748318 B2 | 5/1998 |
| JP | 2797471 B2 | 9/1998 |
| JP | 3178309 B2 | 6/2001 |
| JP | 3300525 B2 | 7/2002 |

OTHER PUBLICATIONS

Iguchi et al. Apr. 1996 English Translation of JP 08-085753 from JPO Web-site.*

Akiba English Jan. 2003 Translation of JP 2003-003066 from JPO Web-site.*

* cited by examiner

*Primary Examiner*—Jeffrey B. Robertson
(74) *Attorney, Agent, or Firm*—Birch, Stewart, Kolasch & Birch LLP (57) ABSTRACT

A conductive resin composition primarily comprising (A) 100 parts by weight of a thermosetting or thermoplastic resin, (B) 5–2,000 parts by weight of a conductive filler, and (C) 0.1–300 parts by weight of organic resin or rubber particulates has a low volume resistivity and stability thereof, and is effectively adherent. When applied to semiconductor packages, the composition can prevent the semiconductor chips from warpage or cracking due to thermal stresses in the semiconductor packages, ensuring the fabrication of semiconductor devices with high reliability.

8 Claims, 1 Drawing Sheet

FIG.1

CONDUCTIVE RESIN COMPOSITION

FIELD OF THE INVENTION

This invention relates to conductive resin compositions having a low volume resistivity, stability thereof, a low modulus and good adherence, and useful as conductive adhesives, electrical contacts and conductive lines on semiconductor chips and substrates for semiconductor devices. The term "conductive" used herein refers to electrical conduction throughout the specification.

BACKGROUND OF THE INVENTION

In the manufacture of semiconductor devices involving the bonding of semiconductor chips to lead frames, a technique of using gold-plated lead frames or pieces of gold tape to form Au—Si eutectic was effective in the past because of its high reliability, but has been replaced by the use of conductive pastes for economical and other reasons. Most conductive pastes used contain metal powder such as silver in organic resins as a binder. In conjunction with the recent tendency of increasing the size of semiconductor chips or elevating the solder reflow temperature, an improvement in reliability of conductive pastes becomes important. In order to obtain a conductive paste having a low volume resistivity, an organic resin as a binder must be filled with a large proportion of conductive powder, which can considerably affect the advantages of the binder resin including low modulus, good adherence, mechanical properties, and ease of working.

SUMMARY OF THE INVENTION

Therefore, an object of the present invention is to provide a conductive resin composition loaded with a relatively small amount of conductive filler and having a low volume resistivity, stability thereof, a low modulus and good adherence.

It has been found that compounding a thermosetting or thermoplastic resin binder with specific amounts of a conductive filler and a particulate organic resin or rubber results in a low volume resistivity despite the reduced content of the conductive filler. As a result, the resin composition maintains the advantages of the binder resin including low modulus, good adherence, mechanical properties, and ease of working.

Accordingly, the present invention provides a conductive resin composition primarily comprising (A) 100 parts by weight of a thermosetting or thermoplastic resin, (B) 5 to 2,000 parts by weight of a conductive filler, and (C) 0.1 to 300 parts by weight of a particulate organic resin or rubber.

The conductive resin composition of the invention has a low volume resistivity and stability thereof and is effectively adherent so that when applied to semiconductor packages, it can prevent the semiconductor chips from warpage or cracking by thermal stresses from the semiconductor packages, ensuring the manufacture of highly reliable semiconductor devices.

DESCRIPTION OF THE PREFERRED EMBODIMENTS

Component A

Component (A) in the conductive resin composition of the invention is a thermosetting or thermoplastic resin. Suitable thermosetting resins include epoxy resins, silicone resins, phenolic resins, urea resins, formaldehyde resins, xylene resins, ketone formaldehyde resins, furan resins, melamine resins, aniline resins, sulfonamide resins, and copolymer resins thereof. Suitable thermoplastic resins include polyimide resins, polyamide resins, polyamide-imide resins, acrylic resins, styrene resins, polycarbonate resins, and copolymer resins thereof. Preferred resins include polyimide resins, polyamide resins, polyamide-imide resins, epoxy resins, silicone resins, phenolic resins, and copolymer resins thereof, with the polyimide resins, epoxy resins and copolymer resins thereof being more preferred.

The polyimide resins which can be used herein include their precursors, polyamic acid resins. The polyamic acid resins have the general formula (1):

(1)

wherein X is a tetravalent organic group containing an aromatic ring or aliphatic ring, Y is a divalent organic group, and n is an integer of 1 to 300. The polyamic acid resins are subjected to dehydration and ring-closing reaction to yield polyimide resins having the general formula (2):

(2)

wherein X is a tetravalent organic group containing an aromatic ring or aliphatic ring, Y is a divalent organic group, and n is an integer of 1 to 300.

The polyamic acid resins having the formula (1) can be prepared by reacting approximately equimolar amounts of a tetracarboxylic dianhydride of the structural formula (3) and a diamine of the structural formula (4) in an organic solvent in a conventional way.

(3)

$$H_2N-Y-NH_2 \quad (4)$$

Herein X and Y are as defined above.

It is noted that in formula (1), n is an integer from 1 to 300, preferably an integer from 2 to 300, and more preferably an integer from 5 to 300. Polyamic acid resins having such a number of recurring units can be readily prepared by the above-described process. Polyimide resins having the formula (2) are formed through dehydration and ring-closing reaction of polyamic acid resins having the formula (1) in a conventional manner.

Illustrative, non-limiting examples of the tetracarboxylic dianhydride of formula (3) are given below.

It is noted that the tetracarboxylic dianhydride of formula (3) may be used alone or in combinations of two or more.

With respect to the diamine of formula (4), it is preferred for adhesion to substrates, flexibility and dispersion of silicone particulates that a diaminosiloxane compound of the structural formula (5) account for 1 to 80 mol %, more preferably 1 to 50 mol % of the diamine of formula (4).

(5)

In formula (5), $R^1$ is a divalent organic group having 3 to 9 carbon atoms, $R^2$ and $R^3$ are substituted or unsubstituted monovalent hydrocarbon groups having 1 to 8 carbon atoms, and m is an integer of 1 to 200.

In the siloxanediamine or α,ω-diaminosiloxane having formula (5), typical divalent organic groups of 3 to 9 carbon atoms represented by $R^1$ are divalent hydrocarbon groups which may contain an ether oxygen atom, including alkylene groups such as —$(CH_2)_3$—, —$(CH_2)_4$—, —$CH_2CH(CH_3)$—, —$(CH_2)_6$—, and —$(CH_2)_8$—, arylene groups such as alkylene-arylene groups which are combinations of the foregoing groups; oxyalkylene groups such as —$(CH_2)_3$—O—, —$(CH_2)_4$—O—, oxyarylene groups such as and oxyalkylene-arylene groups which are combinations of the foregoing groups, such as Suitable substituted or unsubstituted monovalent hydrocarbon groups of 1 to 8 carbon atoms represented by $R^2$ and $R^3$ include alkyl groups such as methyl, ethyl, propyl, isopropyl, butyl, isobutyl, tert-butyl, hexyl, cyclohexyl, 2-ethylhexyl, and octyl; alkenyl groups such as vinyl, allyl, propenyl, isopropenyl, butenyl, isobutenyl, and hexenyl; aryl groups such as phenyl, tolyl and xylyl; aralkyl groups such as benzyl and phenylethyl; substituted ones of the foregoing in which some or all of the hydrogen atoms attached to carbon atoms are substituted with halogen atoms such as fluorine, bromine and chlorine, typically haloalkyl groups such as chloromethyl, bromoethyl and 3,3,3-trifluoropropyl. Of these, methyl and phenyl are preferred. The letter m is an integer from 1 to 200, preferably an integer from 1 to 100, and more preferably an integer from 1 to 80.

Illustrative, non-limiting examples of the siloxanediamine having formula (5) are given below.

It is noted that the diaminosiloxanes of formula (5) may be used alone or in combinations of two or more.

While the diaminosiloxane of formula (5) has been described above, the remainder of the diamine of formula (4) includes a variety of aromatic ring-containing diamines, for example, p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenylsulfone, 4,4'-diaminodiphenylsulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenylthioether)benzene, 1,4-bis(m-aminophenylthioether)benzene, 2,2-bis[4-(4-aminophenoxy)phenyl]-propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]-methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone, and 2,2-bis[4-(4-aminophenoxy)phenyl]perfluoropropane. Of these, preferred are p-phenylenediamine, m-phenylenediamine, 4,4'-diaminodiphenylmethane, 4,4'-diaminodiphenylether, 1,4-bis(3-aminophenoxy)benzene, 1,4-bis(4-aminophenoxy)benzene, 2,2-bis[4-(4-aminophenoxy)phenyl]propane, and 2,2-bis[3-methyl-4-(4-aminophenoxy)phenyl]propane. The remainder of the diamine of formula (4) is not limited to these examples. These diamine compounds may be used alone or in admixture of two or more.

Illustratively, the following reactions are conducted to form the polyamic acid resins and the polyimide resins. The starting reactants, described above, are dissolved in a solvent in an inert atmosphere, after which they are reacted at a temperature below 80° C., preferably 0 to 40° C., to synthesize a polyamic acid resin. The polyamic acid resin thus obtained is heated at a temperature of 100 to 200° C., preferably 150 to 200° C., to induce dehydration and ring-closure on the acid amide moiety of the polyamic acid resin, synthesizing a desired polyimide resin. The organic solvent used in the above reactions may be one in which the starting reactants are not thoroughly dissolvable as long as it is inert to the resulting polyamic acid. Exemplary solvents include tetrahydrofuran, 1,4-dioxane, cyclopentanone, cyclohexanone, γ-butyrolactone, N-methylpyrrolidone, N,N-dimethylacetamide, N,N-dimethylformamide, and dimethylsulfoxide. Of these, aprotic polar solvents are preferred, and N-methylpyrrolidone, cyclohexanone and γ-butyrolactone are most preferred. The solvents may be used alone or in admixture.

In order to facilitate the dehydration and ring-closing reaction, an azeotropic dehydrating agent such as toluene or xylene is desirably used.

In order to regulate the molecular weight of the resin, a dicarboxylic anhydride (e.g., maleic anhydride, phthalic anhydride) and/or a monoamine (e.g., aniline, n-butylamine) may be added. It is noted that the amount of dicarboxylic anhydride added is usually 0 to 2 parts by weight per 100 parts by weight of the dicarboxylic dianhydride, and the amount of monoamine added is usually 0 to 2 parts by weight per 100 parts by weight of the diamine.

The epoxy resins which can be used herein are preferably compounds having at least two epoxy groups per molecule. Their molecular structure, molecular weight and the like are not critical. Suitable epoxy compounds include, for example, diglycidyl ethers of bis(4-hydroxyphenyl)methane and 2,2'-bis(4-hydroxyphenyl)propane or halides thereof, and polycondensates thereof (so-called bisphenol F type epoxy resins and bisphenol A type epoxy resins); butadiene diepoxide, vinylcyclohexene dioxide, diglycidyl ether of resorcinol, 1,4-bis(2,3-epoxypropoxy)benzene, 4,4'-bis(2,3-epoxypropoxy)diphenyl ether, 1,4-bis(2,3-epoxypropoxy) cyclohexene, bis(3,4-epoxy-6-methylcyclohexylmethyl)adipate, epoxy glycidyl ethers or polyglycidyl esters obtained by condensation of 1,2-dihydroxybenzene (or resorcinol), polyhydric phenols or polyhydric alcohols with epichlorohydrin, epoxy novolac resins (i.e., novolac type epoxy resins) obtained by condensation of novolac type phenolic resins (or halogenated novolac type phenolic resins) such as phenol novolac and cresol novolac with epichlorohydrin, epoxidized polyolefins (epoxidized by peroxidation process), epoxidized polybutadiene, naphthalene ring-containing epoxy resins, biphenyl type epoxy resins, phenol aralkyl type epoxy resins, biphenyl aralkyl type epoxy resins, and cyclopentadiene type epoxy resins. It is acceptable to use a mono-epoxy compound in combination with the epoxy compound having at least two epoxy groups per molecule. Exemplary mono-epoxy compounds include styrene oxide, cyclohexene oxide, propylene oxide, methyl glycidyl ether, ethyl glycidyl ether, phenyl glycidyl ether, allyl glycidyl ether, octylene oxide and dodecene oxide. The epoxy resin used herein is not limited to a single type and can be a mixture of two or more types.

The curing agent for the epoxy resin may be selected from many various curing agents which are well known for epoxy resins in the art. Illustrative curing agents include amine compounds such as diethylenetriamine, triethylenetetramine, diethylaminopropylamine, N-aminoethylpiperadine, bis(4-amino-3-methylcyclohexyl)methane, m-xylyleneamine, menthanediamine, and 3,9-bis(3-aminopropyl)-2,4,8,10-tetraoxaspiro(5,5)undecane; modified aliphatic polyamines such as epoxy resin-diethylenetriamine adduct, amine-ethylene oxide adduct, and cyanoethylated polyamine; phenolic resins containing at least two phenolic hydroxyl groups per molecule, such as bisphenol A, trimethylol allyloxyphenol, phenol novolac resins having a low degree of polymerization, epoxidized or butylated phenolic resins, and phenolic resins available under the trade name of Super Beckacite 1001 (Japan Rechhold Chemical Co., Ltd.), Hitanol 4010 (Hitachi Ltd.), Scado form L-9 (Scado Zwoll, Netherlands), and Methylon 75108 (General Electric Company); carbon resins available under the trade name of Beckamine P-138 (Japan Rechhold Chemical Co., Ltd.), Melan (Hitachi Ltd.) and U-Van 10R (Toyo Koatsu Kogyo Co., Ltd.); amino resins such as melamine resins and aniline resins; polysulfide resins having at least two mercapto groups per molecule, as represented by the formula: $HS(C_2H_4OCH_2OC_2H_4SS)_nC_2H_4OCH_2OC_2H_4SH$ wherein n is an integer of 1 to 10; and organic acids and acid anhydrides such as phthalic anhydride, hexahydrophthalic anhydride, tetrahydrophthalic anhydride, pyromellitic anhydride, methylnadic acid, dodecylsuccinic anhydride, and chlorendic anhydride. Of the foregoing curing agents, phenolic resins (specifically phenol novolac resins) are desired in imparting ease of molding and humidity resistance to the inventive composition and because of non-toxicity and relatively low cost. The curing agent used herein is not limited to a single type and mixtures of two or more types may be used depending on their cure ability.

The curing agent may be used in any desired amount depending on a particular type, and usually in an amount of 1 to 100 parts by weight, preferably 5 to 50 parts by weight per 100 parts by weight of the epoxy resin. Less than 1 part of the curing agent is difficult for causing the inventive composition to cure whereas more than 100 parts of the curing agent is uneconomical, requires a longer time for curing because the epoxy resin is diluted therewith, and results in cured products with poor physical properties.

The polyamide resins which can be used herein are prepared by conventional techniques, for example, by polycondensation of dibasic acids with diamines, ring-opening polymerization of cyclic lactam, and polycondensation of aminocarboxylic acids. Illustrative examples include aliphatic polyamide resins such as nylon 66, nylon 6, nylon 610, nylon 612, nylon 11, and nylon 12; aliphatic-aromatic polyamide resins such as nylon MXD6 and nylon MXD6G; aromatic polyamide resins such as poly-m-phenylene isophthalamide (MPIA) and poly-p-phenylene terephthalamide (PPTA), and copolymers and mixtures thereof.

The polyamide-imide resins which can be used herein have amide groups and imide groups in their molecular skeleton and can be obtained, for example, by reacting tricarboxylic acids with diamines in a conventional manner. Suitable tricarboxylic acids include trimellitic acid and trimellitic anhydride. Suitable diamines are those of the above formula (4). Both the acids and diamines may be used alone or in admixture of two or more. Processes for the preparation of polyamide-imide resins include acid chloride process, isocyanate process and direct polymerization. Suitable resins are commercially available under the trade name of TORLON from Amoco, TI-5000 series and TI-1000 series from Toray Co., Ltd., and Sumica PAI from Sumitomo Chemical Co., Ltd.

The phenolic resins which can be used herein may be either resole type phenolic resins which are obtained by reacting a phenol with an excess of formaldehyde in the presence of an alkali catalyst, or novolac type phenolic resins which are obtained by reacting formaldehyde with an excess of a phenol in the presence of an acid catalyst. Illustrative examples include bisphenol type phenolic resins such as bisphenol F resins, bisphenol A resins, and bisphenol AF resins; novolac type phenolic resins such as cresol novolac resins and phenol novolac resins; triphenol alkane type resins, naphthalene ring-containing phenolic resins, biphenyl type phenolic resins, phenolaralkyl type resins, biphenylaralkyl type phenolic resins, and cyclopentadiene type phenolic resins. These phenolic resins may be used alone or in admixture.

The silicone resins which can be used herein include organopolysiloxane compositions of the condensation cure, addition cure, organic peroxide cure, UV cure and EB cure types. Condensation cure type silicones are, for example, those obtained by reacting both end silanol-capped long-chain dimethylpolysiloxane with methylhydrogenpolysiloxane, tetraalkoxysilane, organotrialkoxysilane or partial hydrolytic condensate thereof in the presence of an organic tin catalyst. Addition cure type silicones are, for example, those obtained by conducting reaction (hydrosilylating addition reaction) of linear methylvinylsiloxane having vinyl groups at opposite ends or at opposite ends and within the molecular chain with methylhydrogenpolysiloxane in the presence of a platinum catalyst. Also included are those resulting from radical polymerization of the above linear methylvinylsiloxane in the presence of organic peroxides. UV cure type silicones generally cure by absorbing the energy of ultraviolet radiation having a wavelength 200 to 400 nm and may follow any desired cure mechanism. Illustrative examples include acrylic silicone systems comprising acrylic or methacrylic group-containing organopolysiloxane and a photopolymerization initiator added thereto, mercapto-vinyl addition polymerization systems comprising organopolysiloxane having mercapto groups and unsaturated double bonds such as vinyl and a photopolymerization initiator added thereto, addition reaction systems using the same platinum catalyst as in the heat curing addition reaction type, and cationic polymerization systems comprising epoxy group-containing organopolysiloxane and an onium salt catalyst added thereto. Any of these silicone resins is useful. Electron beam cure type silicones are based on organopolysiloxane having radical polymerizable groups, which is irradiated with electron beams to induce radical polymerization for curing.

Component B

The conductive filler (B) is generally selected from among metal powders, conductive metal-plated powders, conductive inorganic materials such as conductive carbon black, conductive zinc white and conductive titanium oxide, and mixtures thereof. Of these, metal powders, conductive metal-plated powders and mixtures thereof are preferred.

For the metal powder used herein, the particle size is not critical although an average particle size in the range of 0.05 to 100 μm, especially 0.1 to 50 μm is preferred. The shape of metal powder particles is not critical. The metal powder may consist of particles of granular, dendritic, flake or irregular shape, or a mixture thereof. For the purpose of achieving a low resistivity, it is desired that particles be not completely discrete, but partially interconnected.

Examples of the metal powder used herein include silver powder, gold powder and nickel powder, with the silver powder being preferred. The silver powder may be selected from a wide variety of silver powders prepared by electrolysis, grinding, heat treatment, atomizing and chemical process, and is not limited to a particular one. In the preparation of silver powder by the grinding process, the means for grinding silver fragments is not important and any of well-known grinding mills including a stamp mill, ball mill, vibration mill, hammer mill, roll mill and mortar may be used. Reduced silver, atomized silver, electrolytic silver or a mixture of any may be roll milled under any desired conditions, which must be selected depending on the particle size and shape of the final silver powder.

The conductive metal-plated powders used herein include metal-plated silica powders as well as silver-plated glass beads and silver-plated phenolic resins, with the metal-plated silica powders being preferred. The metal-plated silica powders are silica particles surface coated with metal plating. The metal to be plated is selected from gold, silver and nickel, for example, with gold and nickel being preferred. The metal-plated silica powder should desirably have a specific surface area of 1 $m^2/g$ or less. A metal-plated silica powder with a surface area of more than 1 $m^2/g$ may be less dispersible when added to the binder resin. The preferred metal-plated silica powder is of the structure in which silica core is coated with a nickel layer and then with a gold layer. A silicon base compound may be interposed between silica and nickel to enhance the bond between silica and metal. That is, plated silica particles of the four layer structure of silica/silicon base compound/nickel/gold are preferred. Suitable silicon base compounds used for this purpose are carbon functional silane monomers such as KBM-603, KBM-903, KBE-603 and KBE-903 (all by Shin-Etsu Chemical Co., Ltd.) and silicon base polymers having reducing nature.

An appropriate amount of the conductive filler (B) compounded is 5 to 2,000 parts by weight, preferably 10 to 1,000 parts by weight per 100 parts by weight of the thermosetting or thermoplastic resin (A). Less than 5 parts of the conductive filler fails to reduce the volume resistivity to an acceptable level whereas more than 2,000 parts of the conductive filler can considerably affect the properties of the binder resin.

Component C

Component (C) is a microparticulate organic resin or rubber. Silicone rubbers, acrylic rubbers, butadiene rubbers and mixtures thereof are useful. Of these, spherical particulates of silicone rubber are preferred for heat resistance and humidity resistance, and silicone particulates obtained by coating surfaces of the silicone rubber spherical particulates with a polyorganosilsesquioxane resin are especially preferred for compatibility with the binder resin and adhesion.

The spherical particulates of silicone rubber are particulates of spherical shape made of a cured silicone rubber having linear organopolysiloxane blocks of the general formula (6) in a molecular structure and possessing rubber elasticity.

$$—(R^4{}_2SiO)_a— \tag{6}$$

In formula (6), $R^4$ is at least one monovalent group of 1 to 20 carbon atoms selected from among alkyl groups such as methyl, ethyl, propyl and butyl, aryl groups such as phenyl and tolyl, alkenyl groups such as vinyl and allyl, aralkyl groups such as β-phenylethyl and β-phenylpropyl, monovalent halohydrocarbon groups such as chloromethyl and 3,3,3-trifluoropropyl, and substituted ones of the foregoing hydrocarbon groups in which some hydrogen atoms are substituted with organic groups containing a reactive group such as an epoxy, amino, mercapto, acryloxy or methacryloxy group. It is preferred that methyl account for at least 90 mol % of the group $R^4$. If "a" is less than 5, a linear organopolysiloxane fails to fully exert its characteristics, losing the effects of reducing internal stress and improving lubricity. The maximum of "a" need not be specified, but "a" in excess of 5,000 makes it difficult to manufacture spherical particulates of silicone rubber. For this reason, "a" is a number of 5 to 5,000, preferably 10 to 1,000.

The spherical particulates of silicone rubber may contain a silicone oil, organosilane, inorganic powder or organic powder within them. Spherical particulates with an average particle size of less than 0.1 μm do no flow smoothly and become agglomerated whereas particulates with an average particle size of more than 100 μm can adversely affect the moldability and other capabilities of the binder resin. For this reason, spherical particulates of silicone rubber should have an average particle size of 0.1 to 100 µm, preferably 1 to 50 µm.

In the manufacture of spherical particulates of silicone rubber, the crosslinking mechanism may be selected from among condensation reaction between methoxysilyl (≡SiOCH$_3$) and hydroxysilyl (≡SiOH) groups, radical reaction between mercaptosilyl (≡SiSH) and vinylsilyl (≡SiCH=CH$_2$) groups, and addition reaction between vinylsilyl (≡SiCH=CH$_2$) and ≡SiH groups. The addition reaction is preferred from the standpoints of reactivity and process. More specifically, it is preferred to use a composition comprising (a) a vinyl-containing organopolysiloxane and (b) an organohydrogenpolysiloxane which are subjected to addition reaction in the presence of (c) a platinum base catalyst for curing.

Component (a) is a main component of organopolysiloxane of which silicone rubber spherical particulates are formed. It cures by undergoing addition reaction with component (b) under the catalysis of component (c). Component (a) should have at least two vinyl groups attached to silicon atoms in a molecule. These vinyl groups may be located at any portion of the molecule, but are preferably located at least at the end of the molecule. The organic groups attached to silicon atoms other than the vinyl groups may be the same monovalent groups as mentioned above for $R^4$, with at least 90 mol % of the organic groups being desirably methyl. The molecular structure of component (a) may be linear, but the inclusion of a small proportion of branched structure is acceptable. The molecular weight is also not critical.

Spherical particulates of silicone rubber can be prepared by processing the composition into spherical particles while curing through reaction of component (a) with component (b) in the presence of component (c). This can be done in several ways, for example, by curing a mixture of components (a), (b) and (c) while spray drying at elevated temperature, by curing in an organic solvent, or by converting the mixture into an emulsion, followed by curing. The last-mentioned process of converting the mixture into an emulsion and curing particles in emulsion is preferred because a water dispersion of spherical particulates of silicone rubber is conveniently used in the manufacture of silicone particulates.

The silicone particulates used herein are obtained by coating the above spherical particulates of silicone rubber having an average particle size of 0.1 to 100 µm with a polyorganosilsesquioxane resin. The preferred manufacturing process involves furnishing a water dispersion of spherical particulates of silicone rubber having an average particle size of 0.1 to 100 µm, adding thereto an alkaline substance or an alkaline aqueous solution and an organotrialkoxysilane and subjecting the organotrialkoxysilane to hydrolytic condensation reaction. This process advantageously yields silicone particulates suited for use in the inventive composition.

The polyorganosilsesquioxane is a resinous polymer comprising siloxane units of the general formula (7).

$$R^5SiO_{3/2} \quad (7)$$

In formula (7), $R^5$ is at least one monovalent organic group of 1 to 20 carbon atoms selected from among alkyl groups such as methyl, ethyl, propyl and butyl, aryl groups such as phenyl and tolyl, alkenyl groups such as vinyl and allyl, aralkyl groups such as β-phenylethyl and β-phenylpropyl, monovalent halohydrocarbon groups such as chloromethyl and 3,3,3-trifluoropropyl, and substituted ones of the foregoing hydrocarbon groups in which some hydrogen atoms are substituted with organic groups containing a reactive group such as an epoxy, amino, mercapto, acryloxy or methacryloxy group. It is preferred that methyl account for at least 50 mol % of the group $R^5$. In addition to the above $R^5SiO_{3/2}$ units, the polyorganosilsesquioxane may include small amounts of $R^5{}_2SiO_{2/2}$ units, $R^5{}_3SiO_{1/2}$ units and $SiO_2$ units insofar as its covering power is not impaired.

The polyorganosilsesquioxane resin may cover the entire surface of silicone rubber spherical particulates uniformly or part of their surfaces. The amount of the polyorganosilsesquioxane resin should preferably be 1 to 500 parts, more preferably 5 to 100 parts by weight per 100 parts by weight of the silicone rubber spherical particulates. With less than 1 part of the polyorganosilsesquioxane resin, the resulting silicone particulates are less flowing and less dispersible in the inventive resin composition. With more than 500 parts of the polyorganosilsesquioxane resin, the stress reducing effect of silicone rubber spherical particulates is not fully exerted.

An appropriate amount of the particulate organic resin or rubber (C) is 0.1 to 300 parts by weight, preferably 1 to 200 parts by weight per 100 parts by weight of the thermosetting or thermoplastic resin (A). Less than 0.1 part of the particulate organic resin or rubber fails to achieve sufficient cure shrinkage to reduce volume resistivity whereas more than 300 parts of the particulate organic resin or rubber prevents physical contact between conductive fillers, inviting an increase of volume resistivity.

The conductive resin composition of the invention in paste form is coated to a substrate or the like and heat cured thereto to form a conductive layer. In order to reduce the viscosity of the composition for ease of coating and working onto the substrate or the like, the composition may be dispersed in an organic solvent prior to use. Suitable organic solvents include those used in the synthesis of the polyamic acid resin, and aromatic solvents such as toluene and xylene, ketone solvents such as methyl ethyl ketone and methyl isobutyl ketone, ether solvents such as dioxane, and ester solvents such as butyl acetate, propylene glycol monomethyl ether 2-acetate. The organic solvent may be used in an amount not to affect the solubility of the resin.

In an alternative process of forming a conductive layer, the conductive resin composition is shaped into a sheet, which is attached to a substrate or the like as by bonding under applied heat and pressure.

Any desired additives such as antioxidants, heat stabilizers, inorganic fillers (e.g., silica, alumina), pigments, and dyes may be added to the conductive resin composition of the invention insofar as the effectiveness of the invention is not affected.

The conductive layer which is formed of the inventive conductive resin composition is characterized by the reduced dependency of volume resistivity on thickness and a low volume resistivity over a wide range of thickness. Since conductivity is imparted without significantly reducing the substrate adhesion and low modulus characteristic of the binder resin, the conductive layer, when used in the bonding of a semiconductor chip to a lead frame, is effective for restraining the semiconductor chip from warpage and cracking due to thermal stresses, ensuring fabrication of a semiconductor device with high reliability. The inventive conductive resin composition will also find use in formation of conductive bumps, joint of electrical contacts, and formation of wiring patterns, and in a variety of applications where conductivity and processability are required.

EXAMPLE

Examples of the invention are given below by way of illustration and not by way of limitation. It is noted that the viscosity is a measurement at 23° C.

The volume resistivity was measured by the following procedure in accordance with the Society of Rubber Industry Japan, Standard SRIS 2301-1969.

Measurement of Volume Resistivity

Figure 1:
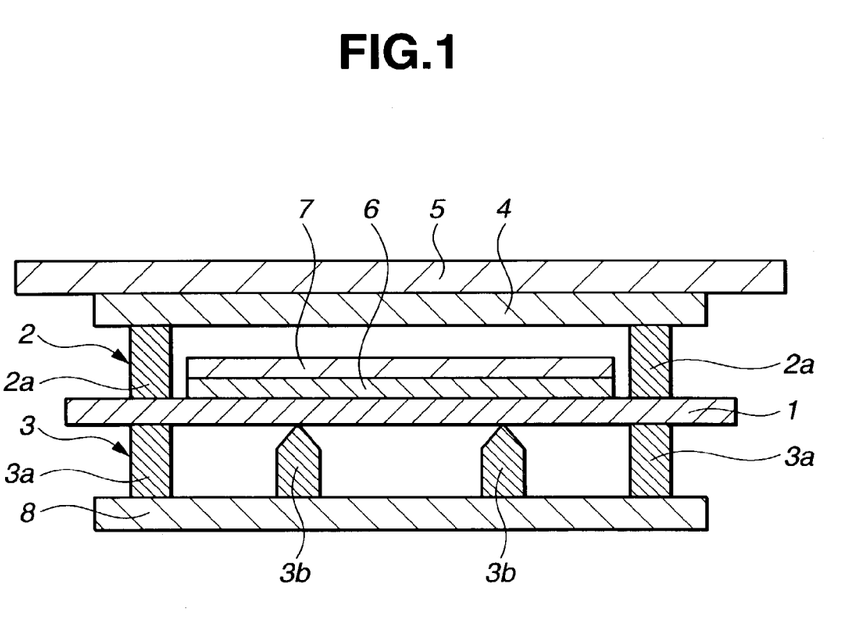
FIG. 1 schematically illustrates a method of measuring volume resistivity.

Referring to FIG. 1, a test piece 1 of 150 mm long, 20 mm wide and 0.01 to 1.0 mm thick is sandwiched between upper and lower electrodes 2 and 3. The upper electrode 2 includes a pair of current terminals 2a and 2a of 30 mm long, 15 mm wide and 5 mm thick which are attached to an insulator 4 of polyethylene. A weight 5 rests on the insulator 4 so that a weight of 5 kg is applied to the current terminals 2a and 2a. The lower electrode 3 includes a pair of current terminals 3a and 3a of 30 mm long, 15 mm wide and 5 mm thick and a pair of knife shaped voltage terminals 3b and 3b of 30 mm long and 5 mm wide. The pair of current terminals 3a and 3a of the lower electrode 3 are opposed to the pair of current terminals 2a and 2a of the upper electrode 2. A weight 7 of 0.5 kg rests on an insulating plate 6 on the test piece 1. The lower electrode 3 is set on an insulating plate 8. In this condition, the upper and lower electrodes 2 and 3 are electrically connected for measuring the volume resistivity of the test piece.

Complex elastic modulus was measured at 25° C. and 30 Hz by a dynamic viscoelasticity spectrometer (Yoshimizu Corp.).

The abbreviations for the starting reactants used in Synthesis Examples have the following meaning.

BPDA: 3,3',4,4'-biphenyltetracarboxylic dianhydride
BTDA: 3,3',4,4'-benzophenonetetracarboxylic dianhydride
DPE: 4,4'-diaminodiphenyl ether
BAPP: 2,2-bis(4-(4-aminophenoxy)phenyl)propane
APM: 1,3-bis(3-aminopropyl)-1,1,3,3-tetramethyldisiloxane

Synthesis Example 1

A flask equipped with a stirrer, thermometer and nitrogen inlet was charged with 9.66 g (0.03 mol) of BTDA as a tetracarboxylic dianhydride component and 30 g of N-methyl-2-pyrrolidone. To the flask, 17.0 g of a N-methyl-2-pyrrolidone solution containing 6.00 g (0.03 mol) of DPE as a diamine component was added dropwise at a controlled rate so that the temperature of the reaction system might not exceed 50° C. After the completion of dropwise addition, the reaction solution was stirred for 12 hours at room temperature for driving the reaction to completion, yielding a yellowish brown clear solution of polyamic acid. The solution had a viscosity of 29 Pa·s and a resin solids content of 25.1%. This is designated polyamic acid solution No. 1.

Synthesis Example 2

In a reactor as used in Synthesis Example 1, 29.42 g (0.10 mol) of BPDA, 7.46 g (0.03 mol) of APM and 28.73 g (0.07 mol) of BAPP were reacted in 196.8 g of cyclohexanone at room temperature for 12 hours, yielding a solution of polyamic acid. To the polyamic acid solution was added 30 g of toluene. A Dimroth condenser with a Dean-Stark trap was attached to the reactor where reaction was conducted at 180° C. for 8 hours, synthesizing a solution of polyimide resin. The solution had a viscosity of 66 Pa·s and a resin solids content of 25.3%. This is designated polyimide solution No. 1.

Synthesis Example 3

A glass beaker having a volume of 1 liter was charged with 500 g of methylvinylsiloxane of the formula (i) having a viscosity of 600 cS and 20 g of methylhydrogenpolysiloxane of the formula (ii) having a viscosity of 30 cS.

The contents were agitated and mixed by operating a homomixer at 2,000 rpm. With 1 g of polyoxyethylene (9 moles addition) octylphenyl ether and 150 g of water added, agitation was continued at 6,000 rpm until phase inversion occurred, with thickening observed. While the solution in this state was sequentially agitated at 2,000 rpm, 329 g of water was added, yielding an O/W type emulsion. The emulsion was then transferred to a glass flask equipped with an agitator having an anchor-shaped impeller. While agitating at room temperature, a mixture of 1 g of a toluene solution of a chloroplatinic acid-olefin complex (platinum content 0.05%) and 1 g of polyoxyethylene (9 moles added) octylphenyl ether was added to the emulsion whereupon reaction was effected for 12 hours, yielding a dispersion, designated silicone rubber spherical particulate water dispersion No. 1. The particle size of particulates in this dispersion was measured by a Coulter counter (Coulter Electronics), finding an average particle size of 15 μm. A 3-liter glass flask was charged with 2,290 g of water, 580 g of the above silicone rubber spherical particulate water dispersion No. 1, and 60 g of aqueous ammonia (concentration 28 wt %). With the water temperature set at 10° C., the contents were agitated by the anchor-shaped impeller at 200 rpm. The liquid was then at pH 11.2. To this liquid, 65 g of methyltrimethoxysilane was added dropwise over 20 minutes while maintaining the liquid at a temperature of 5 to 15° C. Agitation was continued for a further 4 hours. The liquid was then heated to 55 to 60° C. at which agitation was continued for one hour. Using a pressure filter, the liquid was concentrated into a cake having a water content of about 30%. The cake was then dried in a hot air circulation dryer at a temperature of 105° C. and the dried cake was disintegrated by a jet mill. The particulates thus obtained were found to be spherical by observation under an optical microscope. When the particulates were dispersed in water with the aid of a surfactant and measured for particle size by a Coulter counter, the particulates were found to have an average particle size of 15 μm. The silicone particulates were subjected to weight analysis to find that 100 parts by weight of silicone rubber spherical particulates were coated with 10 parts by weight of polyorganosilsesquioxane resin. The silicone particulates thus obtained is designated silicone particulates No. 1.

Synthesis Example 4

Aside from changing the amount of polyoxyethylene (9) octylphenyl ether used in the preparation of an O/W type emulsion in Synthesis Example 3 from 1 g to 5 g, a water dispersion of silicone rubber spherical particulates (designated silicone rubber spherical particulate water dispersion No. 2) was obtained as in Synthesis Example 3. The size of particulates in this dispersion was measured by the Coulter counter, finding an average particle size of 3 μm. Aside from using silicone rubber spherical particulate water dispersion No. 2 instead of silicone rubber spherical particulate water dispersion No. 1, silicone particulates were prepared as in Synthesis Example 3. The particulates thus obtained were found to be spherical by observation under an optical microscope. When the particulates were dispersed in water with the aid of a surfactant and measured for particle size by a Coulter counter, the particulates were found to have an average particle size of 3 μm. The silicone particulates were subjected to weight analysis to find that 100 parts by weight of silicone rubber spherical particulates were coated with 10 parts by weight of polyorganosilsesquioxane resin. The silicone particulates thus obtained is designated silicone particulates No. 2.

Example 1

A conductive paste was prepared by intimately mixing 100 parts by weight of polyamic acid solution No. 1 (polyamic acid resin solids content 25.1 parts by weight) with 80 parts by weight of silver powder having an average particle size of 7 μm and 10 parts by weight of silicone particulates No. 1. The paste was coated to a support plate and heat cured for one hour at 150° C. and then for 4 hours at 250° C., yielding a cured film having a smooth surface and a thickness of about 50 μm. The volume resistivity and complex elastic modulus of the film are shown in Table 1.

Example 2

A conductive paste was prepared by intimately mixing 100 parts by weight of polyamic acid solution No. 1 (polyamic acid resin solids content 25.1 parts by weight) with 100 parts by weight of silver powder having an average particle size of 5 μm and 15 parts by weight of silicone particulates No. 2. The paste was coated to a support plate and heat cured for one hour at 150° C. and then for 4 hours at 250° C., yielding a cured film having a smooth surface and a thickness of about 50 μm. The volume resistivity and complex elastic modulus of the film are shown in Table 1.

Example 3

A conductive paste was prepared by intimately mixing 100 parts by weight of polyamic acid solution No. 1 (polyamic acid resin solids content 25.1 parts by weight) with 100 parts by weight of silver-plated copper powder having an average particle size of 5 μm (Kontaktargen 5 by Eckart GmbH) and 15 parts by weight of silicone particulates No. 2. The paste was coated to a support plate and heat cured for one hour at 150° C. and then for 4 hours at 250° C., yielding a cured film having a smooth surface and a thickness of about 50 μm. The volume resistivity and complex elastic modulus of the film are shown in Table 1.

Example 4

A conductive paste was prepared by intimately mixing 100 parts by weight of polyimide solution No. 1 (polyimide resin solids content 25.3 parts by weight) with 100 parts by weight of silver powder having an average particle size of 7 μm and 15 parts by weight of silicone particulates No. 1. The paste was coated to a support plate and heat cured for one hour at 80° C. and then for 4 hours at 200° C., yielding a cured film having a smooth surface and a thickness of about 50 μm. The volume resistivity and complex elastic modulus of the film are shown in Table 1.

Example 5

A conductive paste was prepared by intimately mixing 100 parts by weight of polyimide solution No. 1 (polyimide resin solids content 25.3 parts by weight) with 100 parts by weight of silver powder having an average particle size of 7 μm and 15 parts by weight of acrylic rubber particulates (F351 by Nippon Zeon Co., Ltd.). The paste was coated to a support plate and heat cured for one hour at 80° C. and then for 4 hours at 200° C., yielding a cured film having a smooth surface and a thickness of about 50 μm. The volume resistivity and complex elastic modulus of the film are shown in Table 1.

Example 6

A conductive paste was prepared by intimately mixing 67.9 parts by weight of an epoxy cresol novolac resin having an epoxy equivalent of 220 (EOCN-102 by Nippon Kayaku Co., Ltd.) and 32.1 parts by weight of a phenol novolac resin (MP-120 by Gunei Chemical Co., Ltd.) with 150 parts by weight of silver powder having an average particle size of 7 μm, 10 parts by weight of silicone particulates No. 1, 1.5 parts by weight of triphenylphosphine as a curing accelerator, and 30 parts by weight of MIBK. The paste was coated to a support plate and heat cured for one hour at 80° C. and then for 4 hours at 180° C., yielding a cured film having a smooth surface and a thickness of about 150 μm. The volume resistivity and complex elastic modulus of the film are shown in Table 1.

Example 7

A conductive paste was prepared by intimately mixing 67.9 parts by weight of an epoxy cresol novolac resin having an epoxy equivalent of 220 (EOCN-102 by Nippon Kayaku Co., Ltd.) and 32.1 parts by weight of a phenol novolac resin (MP-120 by Gunei Chemical Co., Ltd.) with 150 parts by weight of silver-plated copper powder having an average particle size of 5 μm (Kontaktargen 5, Eckart GmbH), 10 parts by weight of silicone particulates No. 2, 1.5 parts by weight of triphenylphosphine as a curing accelerator, and 30 parts by weight of MIBK. The paste was coated to a support plate and heat cured for one hour at 80° C. and then for 4 hours at 180° C., yielding a cured film having a smooth surface and a thickness of about 150 μm. The volume resistivity and complex elastic modulus of the film are shown in Table 1.

Example 8

A conductive paste was prepared by intimately mixing 52.3 parts by weight of a liquid epoxy resin (RE-310 by Nippon Kayaku Co., Ltd.) and 47.7 parts by weight of an acid anhydride base epoxy curing agent (MH-700 by New Japan Chemical Co., Ltd.) with 150 parts by weight of silver powder having an average particle size of 7 μm, 15 parts by weight of silicone particulates No. 1, and 1.0 part by weight of an imidazole curing catalyst (2PZ by Shikoku Chemicals Corp.). The paste was coated to a support plate and heat cured for 4 hours at 180° C., yielding a cured film having a smooth surface and a thickness of about 200 μm. The volume resistivity and complex elastic modulus of the film are shown in Table 1.

Example 9

A conductive paste was prepared by intimately mixing 52.3 parts by weight of a liquid epoxy resin (RE-310 by Nippon Kayaku Co., Ltd.) and 47.7 parts by weight of an acid anhydride base epoxy curing agent (MH-700 by New Japan Chemical Co., Ltd.) with 150 parts by weight of silver powder having an average particle size of 7 μm, 15 parts by weight of acrylic rubber particulates (F351 by Nippon Zeon Co., Ltd.), and 1.0 part by weight of an imidazole curing catalyst (2PZ by Shikoku Chemicals Corp.). The paste was coated to a support plate and heat cured for 4 hours at 180° C., yielding a cured film having a smooth surface and a thickness of about 200 μm. The volume resistivity and complex elastic modulus of the film are shown in Table 1.

Comparative Example 1

A conductive paste was prepared by intimately mixing 100 parts by weight of polyamic acid solution No. 1 (polyamic acid resin solids content 25.1 parts by weight) with 80 parts by weight of silver powder having an average particle size of 7 μm. The paste was coated to a support plate and heat cured for one hour at 150° C. and then for 4 hours at 250° C., yielding a cured film having a smooth surface and a thickness of about 50 μm. The volume resistivity and complex elastic modulus of the film are shown in Table 1.

Comparative Example 2

A conductive paste was prepared by intimately mixing 100 parts by weight of polyamic acid solution No. 1 (polyamic acid resin solids content 25.1 parts by weight) with 100 parts by weight of silver powder having an average particle size of 5 μm. The paste was coated to a support plate and heat cured for one hour at 150° C. and then for 4 hours at 250° C., yielding a cured film having a smooth surface and a thickness of about 50 μm. The volume resistivity and complex elastic modulus of the film are shown in Table 1.

Comparative Example 3

A conductive paste was prepared by intimately mixing 100 parts by weight of polyimide solution No. 1 (polyimide resin solids content 25.3 parts by weight) with 100 parts by weight of silver powder having an average particle size of 7 μm. The paste was coated to a support plate and heat cured for one hour at 80° C. and then for 4 hours at 200° C., yielding a cured film having a smooth surface and a thickness of about 50 μm. The volume resistivity and complex elastic modulus of the film are shown in Table 1.

Comparative Example 4

A conductive paste was prepared by intimately mixing 67.9 parts by weight of an epoxy cresol novolac resin having an epoxy equivalent of 220 (EOCN-102 by Nippon Kayaku Co., Ltd.) and 32.1 parts by weight of a phenol novolac resin (MP-120 by Gunei Chemical Co., Ltd.) with 100 parts by weight of silver powder having an average particle size of 7 μm, 1.5 parts by weight of triphenylphosphine as a curing accelerator, and 115 parts by weight of cyclohexanone. The paste was coated to a support plate and heat cured for one hour at 80° C. and then for 4 hours at 180° C., yielding a cured film having a smooth surface and a thickness of about 150 μm. The volume resistivity and complex elastic modulus of the film are shown in Table 1.

Comparative Example 5

A conductive paste was prepared by intimately mixing 52.3 parts by weight of a liquid epoxy resin (RE-310 by Nippon Kayaku Co., Ltd.) and 47.7 parts by weight of an acid anhydride base epoxy curing agent (MH-700 by New Japan Chemical Co., Ltd.) with 120 parts by weight of silver powder having an average particle size of 7 μm and 1.0 part by weight of an imidazole curing catalyst (2PZ by Shikoku Chemicals Corp.). The paste was coated to a support plate and heat cured for 4 hours at 180° C., yielding a cured film having a smooth surface and a thickness of about 200 μm. The volume resistivity and complex elastic modulus of the film are shown in Table 1.

Comparative Example 6

A conductive paste was prepared by intimately mixing 100 parts by weight of polyamic acid solution No. 1 (polyamic acid resin solids content 25.1 parts by weight) with 80 parts by weight of silver powder having an average particle size of 7 μm and 80 parts by weight of silicone particulates No. 1. The paste was coated to a support plate and heat cured for one hour at 150° C. and then for 4 hours at 250° C., yielding a cured film having a smooth surface and a thickness of about 50 μm. The volume resistivity and complex elastic modulus of the film are shown in Table 1.

TABLE 1

| | Volume resistivity (Ω-cm) | Complex elastic modulus (GPa) |
|---|---|---|
| Example 1 | $6 \times 10^{-5}$ | 4.0 |
| Example 2 | $3 \times 10^{-5}$ | 3.6 |
| Example 3 | $7 \times 10^{-5}$ | 3.6 |
| Example 4 | $8 \times 10^{-5}$ | 3.0 |
| Example 5 | $2 \times 10^{-4}$ | 4.5 |
| Example 6 | $2 \times 10^{-4}$ | 4.0 |
| Example 7 | $4 \times 10^{-4}$ | 4.1 |
| Example 8 | $5 \times 10^{-4}$ | 2.8 |
| Example 9 | $8 \times 10^{-4}$ | 4.0 |
| Comparative Example 1 | $7 \times 10^{-4}$ | 8.0 |
| Comparative Example 2 | $5 \times 10^{-4}$ | 8.1 |
| Comparative Example 3 | $8 \times 10^{-4}$ | 7.2 |
| Comparative Example 4 | $1 \times 10^{-3}$ | 8.3 |
| Comparative Example 5 | $8 \times 10^{-3}$ | 7.1 |
| Comparative Example 6 | $1 \times 10^{-3}$ | 2.9 |

There has been described a conductive resin composition which has a low volume resistivity and stability thereof, and good adherence. When applied to semiconductor packages, the composition can restrain the semiconductor chips from warpage or cracking due to thermal stresses in the semiconductor packages, ensuring the fabrication of semiconductor devices with high reliability.

Japanese Patent Application No. 2002-122239 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A conductive resin composition comprising:
   (A) 100 parts by weight of a thermosetting or thermoplastic resin selected from the group consisting of polyimide resins, polyamic acid resins, polyamide resins, polyamide-imide resins, and phenolic resins,
   (B) 5 to 2,000 parts by weight of a conductive filler, and
   (C) 0.1 to 300 parts by weight of a particulate organic resin or rubber selected from the group consisting of silicone rubbers, silicone rubbers coated with polyorganosilsesquioxane resins, and mixtures thereof,
   wherein said composition has a volume resistivity of $8\times10^{-5}$ Ω·cm or less and at the same time a complex elastic modulus of 4.0 GPa or less after curing thereof.

2. The conductive resin composition of claim 1 wherein component (B) is a metal powder, a conductive metal-plated powder, or a mixture thereof.

3. The conductive resin composition of claim 1 wherein component (C) is spherical particulates of silicone rubber having an average particle size of 0.1 to 100 μm, silicone particulates obtained by coating the spherical particulates of silicone rubber with a polyorganosilsesquioxane resin, or a mixture thereof.

4. A conductive epoxy resin composition comprising:
   (A) 100 parts by weight of an epoxy resin,
   (B) 5 to 2,000 parts by weight of a conductive filler, and
   (C) 0.1 to 300 parts by weight of particulates of silicone rubber, silicone rubbers coated with polyorganosilsesquioxane resin, or a mixture thereof,
   wherein said composition has a volume resistivity of $5\times10^{-4}$ Ω·cm or less and at the same time a complex elastic modulus of 4.1 GPa or less after curing thereof.

5. The conductive resin composition of claim 4, wherein component (B) is a metal powder, a conductive metal-plated powder, or a mixture thereof.

6. The conductive resin composition of claim 4 wherein component (C) is spherical particulates of silicone rubber having an average particle size of 0.1 to 100 μm, silicone particulates obtained by coating said spherical particulates of silicone rubber with a polyorganosilsesquioxane resin, or a mixture thereof.

7. The conductive resin composition of claim 1, wherein said composition has a volume resistivity of from $3\times10^{-5}$ Ω·cm to $8\times10^{-5}$ Ω·cm and at the same time a low complex elastic modulus of from 3.0 GPa to 4.0 GPa after curing thereof.

8. The conductive epoxy resin composition of claim 4, wherein said composition has a volume resistivity of from $2\times10^{-4}$ Ω·cm to $5\times10^{-4}$ Ω·cm and at the same time a low complex elastic modulus of from 2.8 GPa to 4.1 GPa after curing thereof.

* * * * *